United States Patent [19]

Maekawa et al.

[11] 4,099,177
[45] Jul. 4, 1978

[54] KEYBOARD ENTRY CIRCUITRY OF THE KEY STROBING TYPE

[75] Inventors: Koji Maekawa, Yamatokoriyama; Iwao Hamasaki, Miyazaki, both of Japan

[73] Assignee: Sharp Kabushiki Kaisha, Japan

[21] Appl. No.: 712,042

[22] Filed: Aug. 6, 1976

[30] Foreign Application Priority Data

Aug. 11, 1975 [JP] Japan .................. 50-97782

[51] Int. Cl.² ................................ G08C 25/00
[52] U.S. Cl. .................... 340/365 E; 340/365 S
[58] Field of Search .......... 340/365 E, 365 S

[56] References Cited

U.S. PATENT DOCUMENTS

| 3,623,082 | 11/1971 | Stein | 340/365 S |
| 3,777,222 | 12/1973 | Harris | 340/365 S |
| 3,818,441 | 6/1974 | Nomiya | 340/365 E |
| 3,900,845 | 8/1975 | Tsuiki | 340/365 E |

Primary Examiner—Thomas B. Habecker
Attorney, Agent, or Firm—Birch, Stewart, Kolasch & Birch

[57] ABSTRACT

A keyboard entry circuitry for calculator purposes is of the key strobing type wherein one each end of respective key of a keyboard is operatively coupled with corresponding digit time signal or key strobing signal while the other ends of the respective keys are connected in common with each other, whereby the identity of a specific actuated key is provided by determining which one of the key strobing signals is developed via that actuated key. Two kinds of digit time signals are placed within a one-word time sequence, one having different timing phases for the respective keys for key strobing purposes set foth above and the other having the same timing phase for all the keys for shortening a period of time required for key determinations. Once there is a equivalency with respect to both the key strobing digit time signals and the common digit time signal, the indication of any actuated key is provided.

4 Claims, 5 Drawing Figures

KEYBOARD ENTRY CIRCUITRY OF THE KEY STROBING TYPE

BACKGROUND OF THE INVENTION

1. Field of the Invention

The present invention relates to a keyboard entry circuitry for determining accurately which one of a plurality of input keys is actuated, and more particularly to keyboard entry circuitry effective to shorten the period of time required for determinations as to the actuation of a specific key of a keyboard.

2. History of the Prior Art

Keyboard entry circuitry for calculator purposes is conventionally of the key strobing type. This conventional key strobing type of the keyboard entry system utilizes key strobing digit time signals of only one kind supplied to the respective keys of a keyboard and digit time signals outputted via a specific actuated key are sampled several times. Subsequent to this, that keyed information is transferred to a data receiving circuitry. The repetition of sampling is to avoid errors in the key determinations which will be caused due to noises.

That is, when a specific key is actuated, a sampling counter is loaded with the count required for sampling. First of all, determinations are effected as to whether a specific key is actuated and, if an affirmative answer is given, determinations are then effected as to whether the contents of the sampling counter are "0". If the sampling counter is not "0", it will be decremented by one and the operation will be returned to determinations as to the presence or absence of any actuated key. the above operations are sequenced in this manner. Unless "0"is reached by the count of the sampling counter, the identify of the keyed information is not provided.

The count of the sampling cycles is properly chosen due to noise occurrence states and period of time for key actuation. However, because the sampling procedures are repeated several times to confirm an equivalency of the keyed information thereby to avoid errors in key entry, a period of the sampling procedures becomes substantially longer with an accompanying longer period of time up to completion of arithmetic operations on the keyed information.

SUMMARY OF THE INVENTION

Accordingly, it is an object of the present invention to provide an improvement in a keyboard entry circuitry of the key strobing type which performs its key determination procedure within a one-word time sequence.

An important feature of the present invention resides in that key strobing digit time signals having sequentially shifted phases are impressed onto respective keys of a keyboard together with an additional digit time signal having a fixed phase common for all the respective keys. Unless a proper combination of the key strobing digit signals and the common digit signal is evaluated, the identity of a specific actuated key is not provided. This permits shortening of the period of time required for key determinations.

BRIEF DESCRIPTION OF THE DRAWING

A better understanding of the invention may be had from a consideration of the following detailed description taken in conjunction with the accompanying drawings in which.

DETAILED DESCRIPTION OF THE INVENTION

Figure 1:
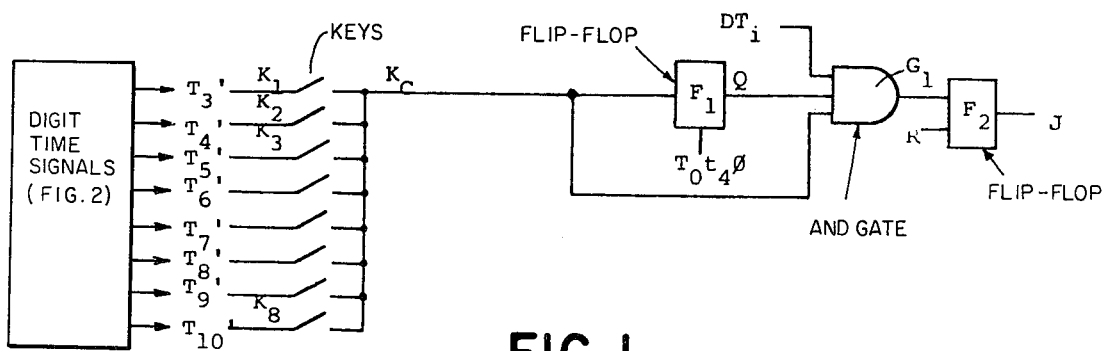
FIG. 1 is a block diagram illustrating a construction of one preferred form of keyboard entry circuitry of the present invention.

Referring now to FIG. 1, there is illustrated one preferred form of keyboard entry circuitry constructed in accordance with the present invention wherein digit time signals $T_{3'}$, $T_{4'}$, . . . having sequentially shifted phases are independently introduced into respective one terminals of keys $K_1$, $K_2$, .... $K_8$ of a keyboard for key strobing purposes, while the other terminals of the keys are connected in common with each other and also with a flip flop $F_1$. The flip flop $F_1$ is of the D type that is synchronous with a timing signal $T_0 t_4$ and provides its outputs for an input to an AND gate $G_1$.

The AND gate $G_1$ determines whether there is an equivalency among the digit select signal $DT_i$ resulting from the actuation of a specific key $K_i$, the outputs Q from the D type flip flop $F_1$ and the signals derived from the commonly connected terminals of the keys, and sets and R-S type flip flop $F_2$ in accordance with the results of such determinations. Although not illustrated in the drawings, comparison is carried out between the outputs J of the flip flop $F_2$ and signals decoded via a four-bit timing counter in accordance with the actuated key. This completes key determinations and as a result the keyed information is transmitted to an information utilizing circuitry. The flip flop $F_2$ is reset by a reset signal $T_o$. The keyed information decoding technique is disclosed in more detail in the U.S. Pat. No. 3,834,616 entitled MULTIPLEXING CONNECTION BETWEEN A KEYBOARD AND AN INTEGRATED CIRCUIT DEVICE, issued on Sept. 10, 1974 and assigned to Sharp K. K. and No. 3,892,957 entitled DIGIT MASK LOGIC COMBINED WITH SEQUENTIALLY ADDRESSED-MEMORY IN ELECTRONIC CALCULATOR CHIP issued on July 1, 1975 and assigned to Texas Instruments Inc.

Figure 2:
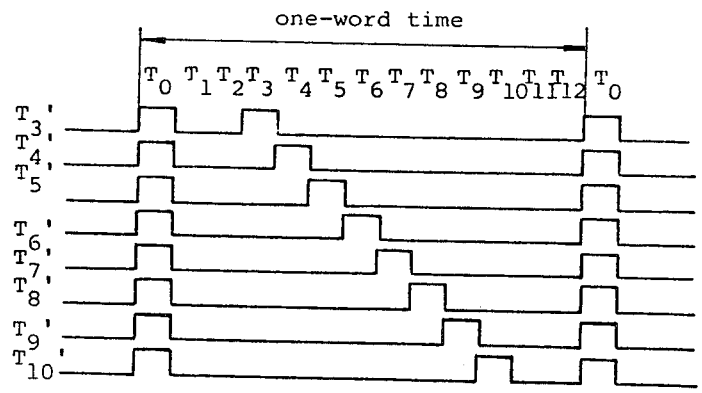
FIG. 2 is a timing diagram illustrating waveforms of digit time signals which occur in the circuitry of FIG. 1.
Figure 3:
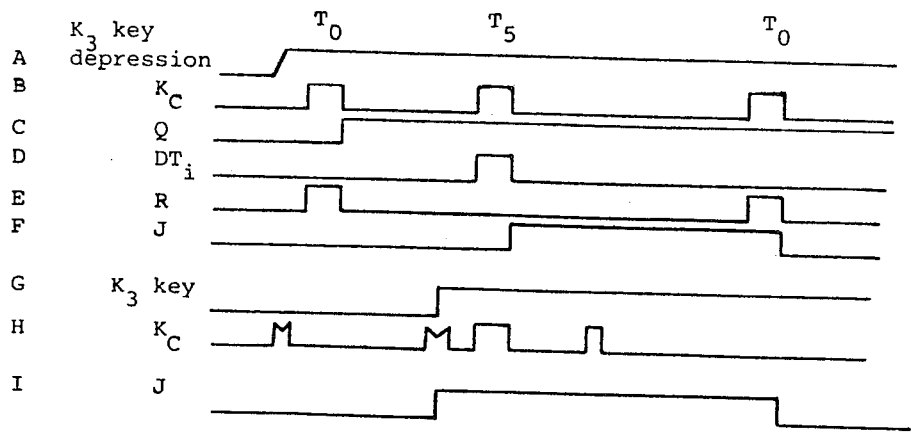
FIG. 3 is a timing diagram illustrating the waveforms of the digit time signals when the circuitry is in operation.

It is to be understood from FIG. 2 that the digit time signals $T_{3'}$, $T_{4'}$, . . . $T_{10'}$ applied to the respective keys consist of key strobing phases $T_3$, $T_4$, . . . $T_{10}$ and the common phase $T_0$. In other words, the important feature of the present invention is the addition of the common phase digit time signal $T_0$ during the key determination procedure. Referring now to FIG. 3, when for example the key switch $K_3$ is manually actuated (the key actuation signal A), the digit time signal consisting of the time slots $T_5$ and $T_0$ is developed at the commonly connected terminals of the keyboard as denoted by B. The D type flip flop $F_1$ is placed into its set state in synchronization with $T_0 T_4$ to permit its outputs Q (denoted by C) to be entered into the AND gate G. When this occurs, the key strobing signals ($T_5$) for the key $K_3$ permits the digit select signal $DT_i$ to be introduced into the input to the AND gate G. It follows that the AND gate G determines if coincidence is established between the digit select signal $DT_i$, the output Q of the D type flip flop $F_1$ and the key strobing signal for the key $K_3$. When the affirmative answer is obtained, the flip flop $F_2$ is set to provide the output J denoted by F. The output J implies that the key $K_3$ is actuated. As a consequence, desired coded signals indicative of the actuated key $K_3$ will be allowed to be entered into a storage register. Since coincidence is determined with respect to both the key strobing digit time signals and the additional common digit time signal in this manner, a high degree of accuracy is ensured in the keyed information entering procedure.

In other words, in the event that coincidence is determined with respect to only the key strobing signals, there is created the possibility of occurring errors in key entry for the following reason. When the key $K_3$ is depressed as denoted by G in FIG. 3, the predetermined key strobing signal is developed at the commonly connected terminals of the keyboard. Under the circumstances, if noises are produced as denoted by H, these noises will force the flip flop $F_2$ into its set state and the outputs of the flip flop $F_2$ denoted by I will be misread as keyed information.

Figure 4:
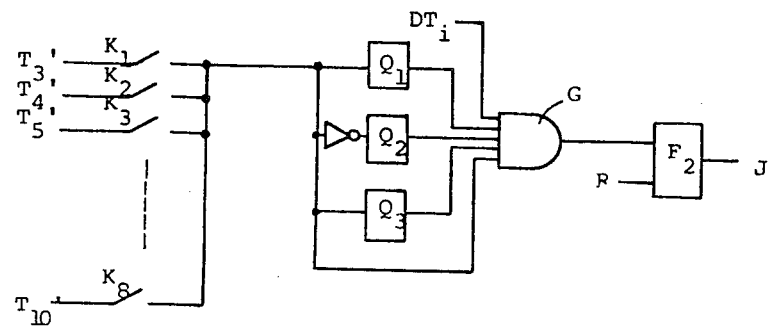
FIG. 4 is a block diagram illustrating another preferred form of the present invention.
Figure 5:
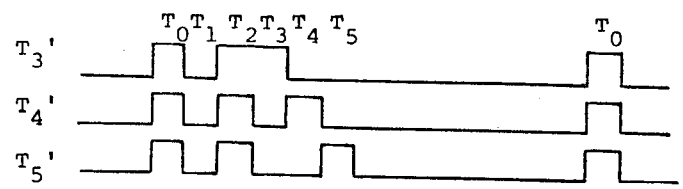
FIG. 5 is a timing diagram illustrating digit time signals which occur in the example of FIG. 4.

FIGS. 4 and 5 illustrate another preferred form of the present invention wherein the commonly connected terminals of the respective keys $K_1$, $K_2$, ... $K_8$ are coupled with D type flip flops $Q_1$, $Q_2$ and $Q_3$. The AND gate G receives the digit select signal $DT_i$, the respective outputs of the flip flops $Q_1$, $Q_2$ and $Q_3$ and the signals derived from the commonly connected terminals of the key switches and determined if there is coincidence therebetween. Once coincidence is established, the R-S type flip flop $F_2$ is placed into its set state. The flip flop $Q_2$ receives the reversal of the signals derived from the commonly connected terminals. The resetting of the R-S type flip flop $F_2$ is by the reset signal $T_0$. The digit time signals $T_{3'}$, $T_{4'}$, ... $T_{10'}$ supplied to the key switches $K_1$, $K_2$, ... $K_8$ are of the waveforms illustrated in FIG. 5. It will be noted that three kinds of the timing signals, that is, the key strobing digit time signals $T_3$, $T_4$ ... $T_{10}$ and two common digit time signals $T_0$ and $T_2$ are in combination supplied to the respective key switches of the keyboard.

Therefore, in the example of FIG. 4, unless the signals are evaluated as "1", "0", and "1" during a sequence of the digit times $T_0$, $T_1$ and $T_2$, the key determination or strobing is not carried out. This avoids or minimizes the possibility of creating misunderstanding of the keyed information.

While a certain representative embodiment and details have been shown for the purpose of illustrating the present invention, it will be apparent to those skilled in this art that various changes and modifications may be made without departing from the spirit or scope of the invention.

What is claimed is:

1. Keyboard entry circuitry of the key strobing type wherein one terminal of the respective keys of a keyboard is connected to receive digit time signals and the other terminals of the respective keys are connected in common whereby determinations as to which one of the keys is actuated are accomplished by sensing the digit time signal resulting from the actuated key, said key entry circuitry comprising:

first means for supplying key strobing digit time signals having different phases for the respective ones of the keys;

second means for supplying an additional digit time signal of the same fixed phase for all the respective keys; and third means for determining coincidence with respect to both the key strobing digit time signals and the additional common digit time signal for each actuated key.

2. A keyboard entry circuitry as set forth in Claim 1 wherein said third means comprises an AND gate receiving three inputs, that is, specific digit time signals resulting from the actuation of a specific key, signals derived from the commonly connected terminals of the keys, and the reversal of the signals from the commonly connected terminals.

3. A keyboard entry circuitry as set forth in claim 2 wherein the reversal of the signals from the commonly connected terminals is provided through a D type flip flop.

4. A keyboard entry circuitry as set forth in claim 1 wherein said additional digit time signals have two or more fixed phases common to all the respective keys.

* * * * *